(12) United States Patent
Wu et al.

(10) Patent No.: US 8,525,568 B2
(45) Date of Patent: Sep. 3, 2013

(54) CLOCK GENERATION CIRCUIT

(75) Inventors: Zhaolei Wu, Chengdu (CN); Yalan Lv, Chengdu (CN); Guosheng Wu, Chengdu (CN)

(73) Assignee: IPGoal Microelectronics (SiChuan) Co., Ltd., Chengdu, Sichuan Province (CN)

( * ) Notice: Subject to any disclaimer, the term of this patent is extended or adjusted under 35 U.S.C. 154(b) by 87 days.

(21) Appl. No.: 13/215,068

(22) Filed: Aug. 22, 2011

(65) Prior Publication Data

US 2012/0133410 A1 May 31, 2012

(30) Foreign Application Priority Data

Nov. 30, 2010 (CN) .......................... 2010 1 0567113

(51) Int. Cl.
*G06F 1/04* (2006.01)
*H03K 3/00* (2006.01)

(52) U.S. Cl.
USPC ............................. 327/291; 327/298; 327/299

(58) Field of Classification Search
USPC .......................................... 327/291, 298, 299
See application file for complete search history.

(56) References Cited

U.S. PATENT DOCUMENTS 7,420,431 B2 * 9/2008 Hwang et al. .................. 331/143

\* cited by examiner

*Primary Examiner* — John Poos

(57) ABSTRACT

A clock generation circuit, includes a first current source, a resistor connected to the first current source, a second current source, a first demux circuit connected to the second current source, a second demux circuit connected to the second current source, a capacitor connected to the first demux circuit and the second demux circuit, a first comparator connected to the first current source and the capacitor, a second comparator connected to the first current source and the capacitor, and a RS trigger connected both to the first comparator and the second comparator. The present invention has simple structure, small process variation, and lower cost, and is able to improve the accuracy of the clock with maximum possibility.

19 Claims, 3 Drawing Sheets

CLOCK GENERATION CIRCUIT

BACKGROUND OF THE PRESENT INVENTION

1. Field of Invention

The present invention relates to the field of integrated circuit, and more particularly to a clock generation circuit.

2. Description of Related Arts

A clock generation circuit is an important part of the integrated circuit design. Usually, off-chip crystals or crystal oscillators are used in integrated circuits to provide accurate clock sources. But the system cost is increased at the same time. Therefore, it is very necessary to design a precious on-chip clock generation circuit.

In traditional on-chip clock generation circuits, a ring oscillator capable of being compensated by process, voltage, temperature, etc. or a RC oscillator is often adopted for generating an accurate clock cycle. However, the ring oscillator capable of being compensated by process, voltage, temperature is more complex to be designed, and more difficult to be technically implemented technical. On the other hand, although it is simple to design a RC oscillator, influenced by the process variations among resistor and capacitor, the accuracy of the clock frequency is limited.

SUMMARY OF THE PRESENT INVENTION

An object of the present invention is to provide a clock generation circuit which has simple structure, and is capable of generating high-precision clock frequency.

Accordingly, in order to accomplish the above object, the present invention provides a clock generation circuit comprising a first current source, a resistor connected to the first current source, a second current source, a first demux circuit connected to the second current source, a second demux circuit connected to the second current source, a capacitor connected to the first demux circuit and the second demux circuit, a first comparator connected to the first current source and the capacitor, a second comparator connected to the first current source and the capacitor, and a RS trigger connected both to the first comparator and the second comparator, wherein the RS trigger outputs clock signals to the input control terminal of the first demux circuit and the input control terminal of the second demux circuit, when the first demux circuit is enabled, the capacitor is charged by the second current source, and when the second demux circuit is enabled, the capacitor is discharged by the second current source.

Compared with existing technologies, the clock generation circuit of the present invention has advantages of simple structure, small process variation, and low cost. Also, the clock cycle generated by the clock generation circuit of the present invention is only relative to capacitance and current ratio. Therefore, the present invention eliminates the effect of resistors so that the accuracy of the clock is able to be improved with maximum possibility These and other objectives, features, and advantages of the present invention will become apparent from the following detailed description, the accompanying drawings, and the appended claims.

DETAILED DESCRIPTION OF THE PREFERRED EMBODIMENT

Figure 1:
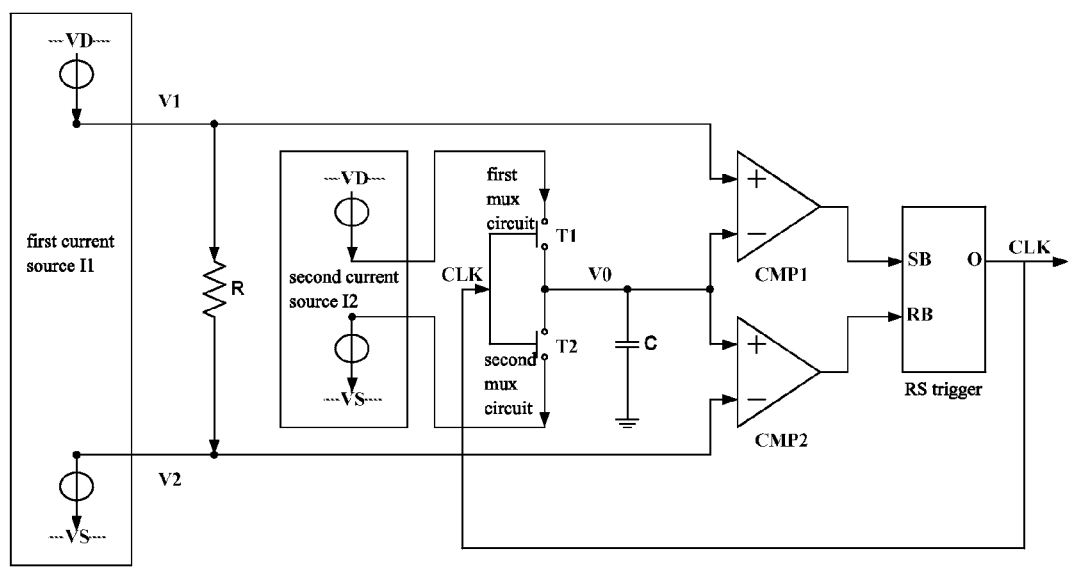
FIG. 1 is a schematic diagram of a clock generation circuit according to a first preferred embodiment of the present invention.

Referring to FIG. 1 of the drawings, a schematic diagram of a clock generation circuit according to a first preferred embodiment of the present invention is illustrated, in which the clock generation circuit comprises a first current source I1, a second current source I2, a resistor R connected to the first current source I1, a capacitor C, a first comparator CMP1 connected to the capacitor C, a second comparator CMP2 connected to the capacitor C, a RS trigger connected both to the first comparator CMP 1 and the second comparator CMP2, and a first demux circuit and a second demux circuit both connected to the second current source I2.

According to the first embodiment, the first current source I1 comprises a first power supply terminal and a first ground terminal, wherein the first current source I1 is proportional to $$\frac{1}{R^2},$$

and given $$I1 = \frac{K_1}{R^2}.$$

The second current source I2 comprises a second power supply terminal and a second ground terminal, wherein the second current source I2 is proportional to $$\frac{1}{R},$$

and given $$I2 = \frac{K_2}{R}.$$

The first power supply terminal and the second power supply terminal are both connected to a power supply VD, and the first ground terminal and the second ground terminal are both connected to a ground VS, wherein the first demux circuit is served as a first switch T1, and the second demux circuit is served as a second switch T2. Here, $K_1$ and $K_2$ are both proportion coefficient.

A first side of the resistor R is connected to the first power supply terminal and the non-inverting input terminal of the first comparator CMP1, and a second side of the resistor R is connected to the first ground terminal and the reversed input terminal of the second comparator CMP2. One side of the first switch T1 is connected to the second power supply terminal, and the other side of the first switch T1 is connected to one side of the capacitor C and the reversed input terminal of the first comparator CMP1. One side of the second switch T2 is connected to the second ground terminal, and the other side of the second switch T2 is connected to one side of the capacitor C and the non-inverting input terminal of the second comparator CMP2. The output terminal of the first comparator CMP1 is connected to the trigger input terminal SB of the RS trigger, and the output terminal of the second comparator CMP2 is connected to the reset input terminal RB of the RS trigger, wherein the output terminal O of the RS trigger outputs clock signals CLK which are input to the input control terminal of the first switch T1 and the input control terminal of the second switch T2.

The working principle of the clock generation circuit mentioned above is described as follows. When the first current source I1 flows through the resistor R, there is a voltage difference V1−V2 generated between a voltage V1 applied on the first side of the resistor R and a voltage V2 applied on the second side of the resistor R, wherein the voltage V1 and voltage V2 are respectively the input signal of the non-inverting input terminal of the first comparator CMP1 and the input signal of the reversed input terminal of the second comparator CMP2. When the first demux circuit is enabled, the capacitor C is charged by the second current source I2, and when the second demux circuit is enabled, the capacitor C is discharged by the second current source I2. The capacitor voltage of the capacitor C is marked as V0. Given V0>V1>V2, the first comparator CMP1 outputs a low level signal, and the second comparator CMP2 outputs a high level signal. During this period, the clock signal CLK of the RS trigger enables the second demux circuit, and the capacitor C is discharged by the second current source I2 and the capacitor voltage V0 starts to get smaller. Until V2<V0<V1, the first comparator CMP1 and the second comparator CMP2 both output a low level signal. During this period, keeping the output of the RS trigger uncharged and the second demux circuit enabled, the capacitor C is discharged by the second current source I2 and the capacitor voltage V0 continues to get smaller. Until V0<V2<V1, the first comparator CMP1 outputs a high level signal, and the second comparator CMP2 outputs a low level signal. During this period, the clock signal CLK of the RS trigger enables the first demux circuit, and the capacitor C is charged by the second current source I2 and the capacitor voltage V0 starts to get bigger. Until V2<V0<V1, the first comparator CMP1 and the second comparator CMP2 both output a low level signal. During this period, keeping the output of the RS trigger uncharged and the first demux circuit enabled, the capacitor C is charged by the second current source I2 and the capacitor voltage V0 continues to get bigger. Until V0>V1>V2, the first comparator CMP1 outputs a low level signal, and the second comparator CMP2 outputs a high level signal. During this period, the clock signal CLK of the RS trigger enables the second demux circuit, and the capacitor C is discharged by the second current source I2 and the capacitor voltage V0 starts to get smaller, therefore, an entire clock cycle is completed.

Taking no account of the delay of the comparators CMP1, CMP2 and the RS trigger, the formulas of the clock cycle are described as follows.

The voltage difference generated by the first current source I1 flowing through the resistor R is $$\Delta V = V1 - V2 = K_1 * \frac{1}{R^2} * R = \frac{K_1}{R}.$$

The charge and discharge rate of the capacitor C charged/discharged by the second current source I2 is $$SR = \frac{K_2 * \frac{1}{R}}{C} = \frac{K_2}{RC}.$$

The entire charge time or the entire discharge time of the capacitor C charged/discharged by the second current source I2 is $$\Delta T = \frac{\Delta V}{SR} = \frac{K_1}{R} * \frac{RC}{K_2} = \frac{K_1 C}{K_2}.$$

The entire clock cycle is $$T = 2\Delta T = \frac{2K_1 C}{K_2}.$$

From the formulas above, it is clearly that the clock cycle generated by the clock generation circuit of the present invention is only relative to the capacitance of the capacitor C and the ratio of the first current source I1 to the second current source I2. That is, the present invention eliminates the effect of the resistor R so that the accuracy of the clock is able to be improved with maximum possibility.

Figure 2:
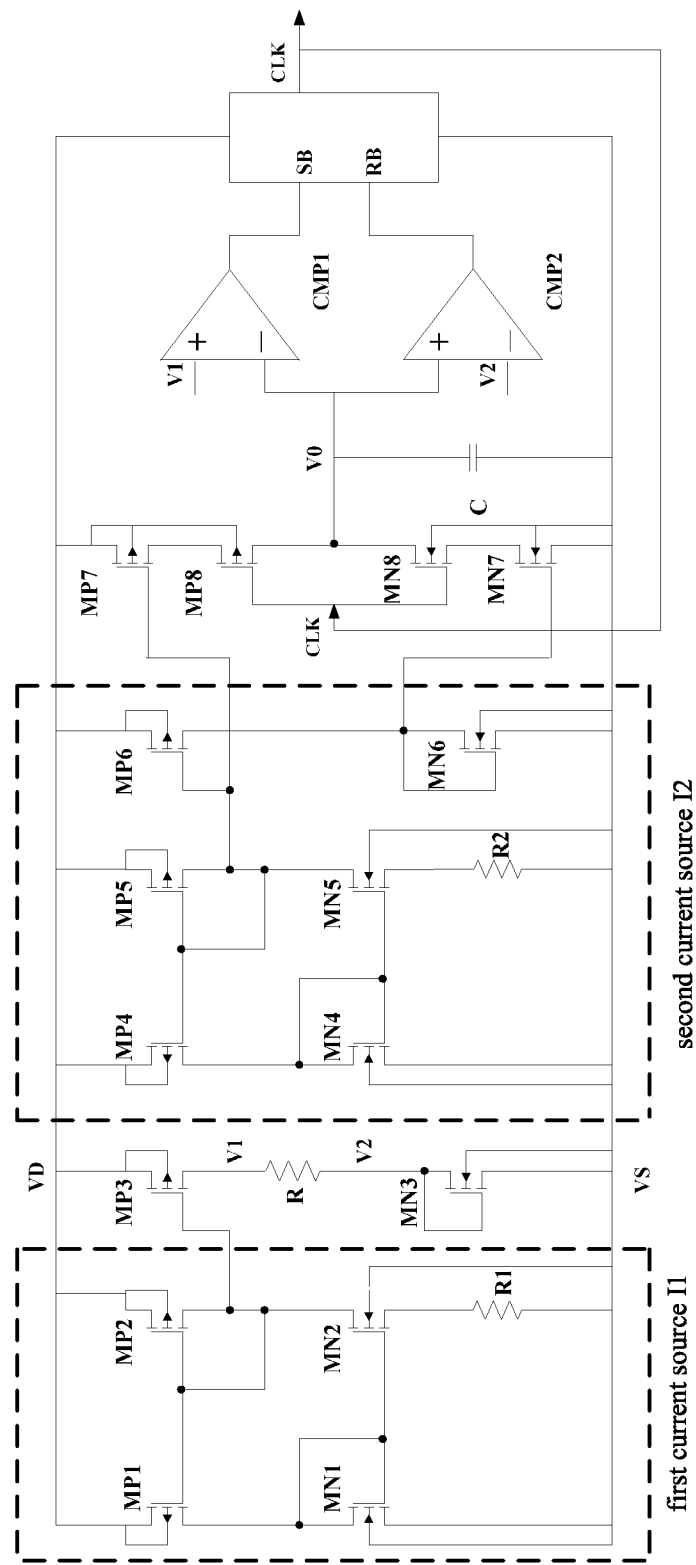
FIG. 2 is a circuit diagram of the clock generation circuit according to the above first preferred embodiment of the present invention.

Referring to FIG. 2 of the drawings, a circuit diagram of the clock generation circuit according to the first preferred embodiment of the present invention is illustrated, in which the clock generation circuit comprises a first field effect transistor (FET) MP1, a second FET MP2, a third FET MP3, a fourth FET MP4, a fifth FET MP5, a sixth FET MP6, a seventh FET MP7, an eighth FET MP8, a ninth FET MN1, a tenth FET MN2, an eleventh FET MN3, a twelfth FET MN4, a thirteenth FET MN5, a fourteenth FET MN6, a fifteenth FET MN7, a sixteenth FET MN8, a first resistor R1, a second resistor R2, the resistor R, the capacitor C, the first comparator CMP1, the second comparator CMP2, and the RS trigger. Here, the first FET MP1, the second FET MP2, the ninth FET MN1, the tenth FET MN2 and the first resistor R1 are connected together to constitute the first current source I1. And the fourth FET MP4, the fifth FET MP5, the sixth FET MP6, the twelfth FET MN4, the thirteenth FET MN5, the fourteenth FET MN6 and the second resistor R2 are connected together to constitute the second current source I2. The first demux circuit comprises the eighth FET MP8, and the second demux circuit comprises the sixteenth FET MN8. Other components constitute the external bias circuits.

According to the first preferred embodiment, the first FET MP1, the second FET MP2, the third FET MP3, the fourth FET MP4, the fifth FET MP5, the sixth FET MP6, the seventh FET MP7 and the eighth FET MP8 are P-type metal oxide semiconductor (PMOS); the ninth FET MN1, the tenth FET MN2, the eleventh FET MN3, the twelfth FET MN4, the thirteenth FET MN5, the fourteenth FET MN6, the fifteenth FET MN7 and the sixteenth FET MN8 are N-type metal oxide semiconductor (NMOS). In other embodiments or alternatives, the FETs can be replaced by the other switching components or circuits which are capable of achieving the same function as required.

The connection relations of the clock generation circuit according to the first preferred embodiment are described as follows. The gate electrode of the first FET MP1, the gate electrode and the drain electrode of the second FET MP2, and the gate electrode of the third FET MP3 are all connected to the drain electrode of the tenth FET MN2; the source electrode and the bulk electrode of the first FET MP1, the source electrode and the bulk electrode of the second FET MP2, the source electrode and the bulk electrode of the third FET MP3, the source electrode and the bulk electrode of the fourth FET MP4, the source electrode and the bulk electrode of the fifth FET MP5, the source electrode and the bulk electrode of the sixth FET MP6, the source electrode and the bulk electrode of the seventh FET MP7, the source electrode and the bulk electrode of the eighth FET MP8 are all connected to a power supply VD; the drain electrode of the first FET MP1 is connected to the drain electrode and the gate electrode of the ninth FET MN1, and the gate electrode of the tenth FET MN2. The drain electrode of the third FET MP3 is connected to the gate electrode and the drain electrode of the eleventh FET MN2 via the resistor R. The gate electrode of the fourth FET MP4, the gate electrode and the drain electrode of the fifth FET MP5, the gate electrode of the sixth FET MP6 and the gate electrode of the seventh FET MP7 are all connected to the drain electrode of the thirteenth FET MN5; the drain electrode of the fourth FET MP4 is connected to the drain electrode and the gate electrode of the twelfth FET MN4, and the gate electrode of the thirteenth FET MN5. The drain electrode of the sixth FET MP6 is connected to the gate electrode and the drain electrode of the fourteenth FET MN6, and the gate electrode of the fifteenth FET MN7. The drain electrode of the seventh FET MP7 is connected to the source electrode of the eighth FET MP8. The gate electrode of the eighth FET MP8 and the gate electrode of the sixteenth FET MN8 are both connected to the output terminal O of the RS trigger; the drain electrode of the eighth FET MP8 and the drain electrode of the sixteenth FET MN8 are both connected to the reversed input terminal of the first comparator CMP1 and the non-inverting input terminal of the second comparator CMP2, and are also connected through the capacitor C to ground VS. The source electrode and the bulk electrode of the ninth FET MN1, the bulk electrode of the tenth FET MN2, the source electrode and the bulk electrode of the eleventh FET MN3, the source electrode and the bulk electrode of the twelfth FET MN4, the bulk electrode of the thirteenth FET MN5, the source electrode and the bulk electrode of the fourteenth FET MN6, the source electrode and the bulk electrode of the fifteenth FET MN7, and the bulk electrode of the sixteenth FET MN8 are all connected to ground VS. The source electrode of the tenth FET MN2 is connected through the first resistor R1 to ground VS; the source electrode of the thirteenth FET MN5 is connected through the second resistor R2 to ground VS. The drain electrode of the fifteenth FET MN7 is connected to the source electrode of the sixteenth FET MN8.

The working principle of the clock generation circuit according to the first preferred embodiment is described as follows. The ninth FET MN1 and the tenth FET MN2 operate in saturation regions, and have same width/length ratio A1. The first FET MP1, the second FET MP2 and the third FET MP3 constitute a current amplifier, whose amplification factor is parameter determined by design, and here is assumed to be 1. Ignoring the body effects on PMOS and NMOS, according to the present working state of the clock generation circuit, we can see that the current flowing through the resistor R is $$I_1 = \frac{2}{\mu_n C_{ox}\left(\frac{W}{L}\right)_1} * \frac{1}{R_1^2} * \left(1 - \frac{1}{\sqrt{A1}}\right)^2.$$

So, the voltage difference between the two sides of the resistor R is $$\Delta V = V1 - V2 = I_1 R.$$

The twelfth FET MN4 and the thirteenth FET MN5 operate in subthreshold regions, and have same width/length ratio A2. The fourth FET MP4, the fifth FET MP5, the sixth FET MP6 and the seventh FET MP7 constitute a current amplifier, whose amplification factors is parameter determined by design, and here is assumed to be 1. Ignoring the body effects on PMOS and NMOS, according to the present working state of the clock generation circuit, we can see that the charge current and the discharge current of the capacitor C is $$I_2 = \frac{\xi V_T * \ln A2}{R_2}.$$

So, the entire clock cycle is $$T = 2\Delta T = \frac{\Delta V}{\frac{I_2}{C}} = \frac{2}{\mu_n C_{ox}\left(\frac{W}{L}\right)_1} * \frac{1}{R_1^2} * \left(1 - \frac{1}{\sqrt{A1}}\right)^2 * R * C * \frac{R_2}{\xi V_T * \ln A2} =$$

$$\frac{2}{\mu_n C_{ox}\left(\frac{W}{L}\right)_1 \xi V_T * \ln A2} * \left(1 - \frac{1}{\sqrt{A1}}\right)^2 * \frac{RR_2}{R_1^2} * C$$

Here, $\mu_n$ denotes the electron mobility of NMOS; $C_{ox}$ denotes the Cox of the capacitor C;

$$\left(\frac{W}{L}\right)_1$$

denotes the width/length ratio of the ninth FET MN1; $\xi$ denotes the non-ideality factor when the transistors operating in subthreshold regions; $V_T$ denotes thermodynamic constants. If the resistors as mentioned above are same in type, the effects generated by production process and temperature among different resistors can be canceled each other out. The temperature coefficient of $V_T$ is a positive value, and the temperature coefficient of $\mu_n$ is a negative value, so that the temperature characteristics can be compensated. Even in standard CMOS process, the capacitor C can be ordinary MOS or N-well NMOS, and the capacitance of the capacitor is in approximate direct proportion to $W*L*C_{ox}$. Hence, the $C_{ox}$ in denominator is canceled so as to eliminate process variation among different transistors. In summary, the clock cycle generated by the clock generation circuit according to the first preferred embodiment has good temperature coefficient, small process variation, simply design, and low cost.

Figure 3:
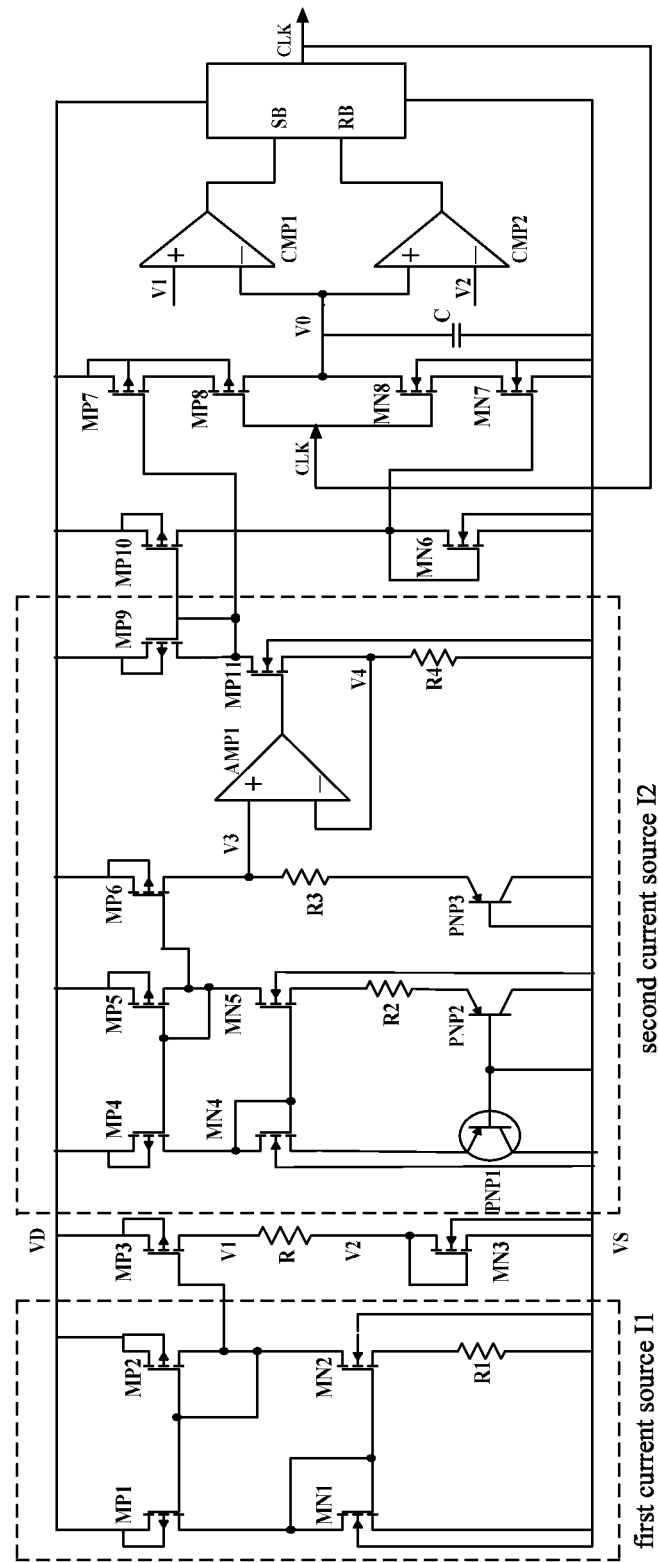
FIG. 3 is a circuit diagram of the clock generation circuit according to a second preferred embodiment of the present invention.

Referring to FIG. 3 of the drawings, a circuit diagram of the clock generation circuit according to a second preferred embodiment of the present invention is illustrated, in which the clock generation circuit comprises a first field effect transistor (FET) MP1, a second FET MP2, a third FET MP3, a fourth FET MP4, a fifth FET MP5, a sixth FET MP6, a seventh FET MP7, an eighth FET MP8, a ninth FET MP9, a tenth FET MP10, an eleventh FET MP11, a twelfth FET MN1, a thirteenth FET MN2, a fourteenth FET MN3, a fifteenth FET MN4, a sixteenth FET MN5, a seventeenth FET MN6, an eighteenth FET MN7, a nineteenth FET MN8, a first triode PNP1, a second triode PNP2, a third triode PNP3, a first resistor R1, a second resistor R2, a third resistor R3, a fourth resistor R4, the resistor R, the capacitor C, the first comparator CMP1, the second comparator CMP2, an operation amplifier AMP1, and the RS trigger. Here, the first FET MP1, the second FET MP2, the twelfth FET MN1, the thirteenth FET MN3 and the first resistor R1 are connected together to constitute the first current source I1. And the fourth FET MP4, the fifth FET MP5, the sixth FET MP6, the ninth FET MP9, the eleventh FET MP11, the fifteenth FET MN4, the sixteenth FET MN5, the second resistor R2, the third resistor R3, the fourth resistor R4, the first triode PNP1, the second triode PNP2, the third triode PNP3, and the operation amplifier AMP1 are connected together to constitute the second current source I2. The first demux circuit comprises the tenth FET MP10, and the second demux circuit comprises the nineteenth FET MN8. Other components constitute the external bias circuits.

According to the second preferred embodiment, the first FET MP1, the second FET MP2, the third FET MP3, the fourth FET MP4, the fifth FET MP5, the sixth FET MP6, the seventh FET MP7, the eighth FET MP8, the ninth FET MP9, the tenth FET MP10, and the eleventh FET MP11 are P-type metal oxide semiconductor (PMOS); the twelfth FET MN1, the thirteenth FET MN2, the fourteenth FET MN3, the fifteenth FET MN4, the sixteenth FET MN5, the seventeenth FET MN6, the eighteenth FET MN7, and the nineteenth FET MN8 are N-type metal oxide semiconductor (NMOS). In other embodiments or alternatives, the FETs can be replaced by the other switching components or circuits which are capable of achieving the same function as required.

The connection relations of the clock generation circuit according to the second preferred embodiment are described as follows. The gate electrode of the first FET MP1, the gate electrode and the drain electrode of the second FET MP2, and the gate electrode of the third FET MP3 are all connected to the drain electrode of the tenth FET MN2; the source electrode and the bulk electrode of the first FET MP1, the source electrode and the bulk electrode of the second FET MP2, the source electrode and the bulk electrode of the third FET MP3, the source electrode and the bulk electrode of the fourth FET MP4, the source electrode and the bulk electrode of the fifth FET MP5, the source electrode and the bulk electrode of the sixth FET MP6, the source electrode and the bulk electrode of the seventh FET MP7, the bulk electrode of the eighth FET MP8, the source electrode and the bulk electrode of the ninth FET MP9, the source electrode and the bulk electrode of the tenth FET MP10, the bulk electrode of the eleventh FET MP11 are all connected to a power supply VD; the drain electrode of the first FET MP1 is connected to the drain electrode and the gate electrode of the twelfth FET MN1, the gate electrode of the thirteenth FET MN2. The drain electrode of the third FET MP3 is connected through the resistor R to the gate electrode and the drain electrode of the fourteenth FET MN3. The gate electrode of the fourth FET MP4, the gate electrode and the drain electrode of the fifth FET MP5, and the gate electrode of the sixth FET MP6 are all connected to the drain electrode of the sixteenth FET MN5; the drain electrode of the fourth FET MP4 is connected to the drain electrode and the gate electrode of the fifteenth FET MN4, and the gate electrode of the sixteenth FET MN5. The drain electrode of the sixth FET MP6 is connected to the non-inverting input terminal of the operation amplifier AMP1, and is also connected through the third resistor R3 to the emitter of the third triode PNP3. The gate electrode and the drain electrode of the ninth FET MP9, the gate electrode of the tenth FET MP10, the gate electrode of the seventh FET MP7, and the source electrode of the eleventh FET MP11 are connected together. The drain electrode of the tenth FET MP10 is connected to the gate electrode and the drain electrode of the seventeenth FET MN6, and the gate electrode of the eighteenth FET MN7. The drain electrode of the seventeenth FET MP7 is connected to the source electrode of the eighth FET MP8. The gate electrode of the eighth FET MP8, the gate electrode of the nineteenth FET MN8 are both connected to the output terminal O of the RS trigger; the drain electrode of the eighth FET MP8, the drain electrode of the nineteenth FET MN8 are both connected to the reversed input terminal of the first comparator CMP1 and the reversed input terminal of the second comparator CMP2, and also connected through the capacitor C to ground VS. The source electrode and the bulk electrode of the twelfth FET MN1, the bulk electrode of the thirteenth FET MN2, the source electrode and the bulk electrode of the fourteenth FET MN3, the bulk electrode of the fifteenth FET MN4, the bulk electrode of the sixteenth FET MN5, the source electrode and the bulk electrode of the seventeenth FET MN6, the source electrode and the bulk electrode of the eighteenth FET MN7, the bulk electrode of the nineteenth FET MN8, the base and the collector of the first triode PNP1, the base and the collector of the second triode PNP2, and the base and the collector of the third triode PNP3 are all connected to the power supply VD. The source electrode of the thirteenth FET MN2 is connected through the first resistor R1 to the power supply VD. The source electrode of the fifteenth FET MN4 is connected to the emitter of the first triode PNP1. The source electrode of the sixteenth FET MN5 is connected through the second resistor R2 to the emitter of the second triode PNP2. The drain electrode of the eighteenth FET MN7 is connected to the source electrode of the nineteenth FET MN8.

The working principle of the clock generation circuit according to the second preferred embodiment is described as follows. The twelfth FET MN1 and the thirteenth FET MN2 operate in saturation regions, and have same width/length ratio B1. The first FET MP1, the second FET MP2 and the third FET MP3 constitute a current amplifier, whose amplification factor is parameter determined by design, and here is assumed to be 1. Ignoring the body effects on PMOS and NMOS, according to the present working state of the clock generation circuit, we can see that the current flowing through the resistor R is $$I_1 = \frac{2}{\mu_n C_{ox}\left(\frac{W}{L}\right)_1} * \frac{1}{R_1^2} * \left(1 - \frac{1}{\sqrt{B1}}\right)^2.$$

So, the voltage difference between the two sides of the resistor R is $$\Delta V = V1 - V2 = I_1 R.$$

The fifteenth FET MN4, the sixteenth FET MN5, the fourth FET MP4, and the fifth FET MP5 all operate in saturation regions, and have same width/length ratio 1. The area ratio of the first triode PNP1 and the second triode PNP2 is a given B2.

So, a reference voltage between the high side of the third resistor R3 and the non-inverting input terminal of the operation amplifier AMP1 is $$V_3 = V_{be} + \frac{R_3}{R_2} V_T \ln B2,$$

the second current source is $$I_2 = \frac{V_3}{R_4} = \frac{V_{be} + \frac{R_3}{R_2}V_T \ln B2}{R_4},$$

so, the entire clock cycle is $$T = 2\Delta T =$$

$$\frac{\Delta V}{\frac{I_3}{C}} = \frac{2}{\mu_n C_{ox}\left(\frac{W}{L}\right)_1} * \frac{1}{R_1^2} * \left(1 - \frac{1}{\sqrt{B1}}\right)^2 * R * C * \frac{R_4}{V_{be} + \frac{R_3}{R_2}V_T \ln B2} =$$

$$\frac{2}{\mu_n C_{ox}\left(\frac{W}{L}\right)_1 \left(V_{be} + \frac{R_3}{R_2}V_T \ln B2\right)} * \left(1 - \frac{1}{\sqrt{B1}}\right)^2 * \frac{RR_4}{R_1^2} * C$$

Here, $\mu_n$ denotes the electron mobility of NMOS; $C_{ox}$ denotes the Cox of the capacitor C;

$$\left(\frac{W}{L}\right)_1$$

denotes the width/length ratio of the twelfth FET MN1; $\xi$ denotes the non-ideality factor when the transistors operating in subthreshold regions; $V_T$ denotes thermodynamic constants. The temperature coefficient of $$V_{be} + \frac{R_3}{R_2}V_T \ln B2$$

as mentioned above is adjustable, therefore, the negative temperature characteristic of the $\mu_n$ can be compensated by adjusting the temperature coefficient of $$V_{be} + \frac{R_3}{R_2}V_T \ln B2.$$

The resistor R, the first resistor R1, the second resistor R2, the third resistor R3 and the fourth resistor R4 are same in type, so that the effects generated by production process and temperature among different resistors can be canceled each other out. Even in standard CMOS process, the capacitor C can be ordinary MOS or N-well NMOS, and the capacitance of the capacitor is in approximate direct proportion to $W*L*C_{ox}$. Hence, the $C_{ox}$ in denominator is canceled so as to eliminate process variation among different transistors. In summary, the clock cycle generated by the clock generation circuit according to the second preferred embodiment has good temperature coefficient, small process variation, simply design, and low cost.

The clock generation circuit provided by the present invention has advantages of simple structure, small process variation, and low cost. Also, the clock cycle generated by the clock generation circuit of the present invention is only relative to the capacitance of the capacitor C and the ratio of the first current source I1 to the second current source I2. That is, the present invention eliminates the effect of the resistors so that the accuracy of the clock is able to be improved with maximum possibility.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A clock generation circuit, comprising: a first current source, a resistor connected to the first current source, a second current source, a first demux circuit connected to the second current source, a second demux circuit connected to the second current source, a capacitor connected to the first demux circuit and the second demux circuit, a first comparator connected to the first current source and the capacitor, a second comparator connected to the first current source and the capacitor, and a RS trigger connected both to the first comparator and the second comparator, wherein the RS trigger outputs clock signals to an input control terminal of the first demux circuit and an input control terminal of the second demux circuit, when the first demux circuit is enabled, the capacitor is charged by the second current source, and when the second demux circuit is enabled, the capacitor is discharged by the second current source, wherein the resistance of the resistor is R, the first current source is proportional to $$\frac{1}{R^2},$$

and the second current source is proportional to $$\frac{1}{R}.$$

2. The clock generation circuit, as recited in claim 1, wherein the first current source comprise a first power supply terminal and a first ground terminal, a first side of the resistor is connected to the first power supply terminal and an non-inverting input terminal of the first comparator, and a second side of the resistor is connected to the first ground terminal and an reversed input terminal of the second comparator.

3. The clock generation circuit, as recited in claim 2, wherein the first demux circuit is served as a first switch, and the second demux circuit is served as a second switch, wherein the second current source comprises a second power supply terminal and a second ground terminal, wherein one side of the first switch is connected to the second power supply terminal, and the other side of the first switch is connected to one side of the capacitor and a reversed input terminal of the first comparator, one side of the second switch is connected to the second ground terminal, and the other side of the second switch is connected to one side of the capacitor and a non-inverting input terminal of the second comparator.

4. The clock generation circuit, as recited in claim 3, wherein an output terminal of the first comparator is connected to a trigger input terminal of the RS trigger, and an output terminal of the second comparator is connected to a reset input terminal of the RS trigger, wherein an output terminal of the RS trigger outputs clock signals.

5. The clock generation circuit, as recited in claim 1, wherein the first current source comprise a first power supply terminal and a first ground terminal, a first side of the resistor is connected to the first power supply terminal and an non-inverting input terminal of the first comparator, and a second side of the resistor is connected to the first ground terminal and an reversed input terminal of the second comparator.

6. The clock generation circuit, as recited in claim 5, wherein the first demux circuit is served as a first switch, and the second demux circuit is served as a second switch, wherein the second current source comprises a second power supply terminal and a second ground terminal, wherein one side of the first switch is connected to the second power supply terminal, and the other side of the first switch is connected to one side of the capacitor and a reversed input terminal of the first comparator, one side of the second switch is connected to the second ground terminal, and the other side of the second switch is connected to one side of the capacitor and a non-inverting input terminal of the second comparator.

7. The clock generation circuit, as recited in claim 6, wherein an output terminal of the first comparator is connected to a trigger input terminal of the RS trigger, and an output terminal of the second comparator is connected to a reset input terminal of the RS trigger, wherein an output terminal of the RS trigger outputs clock signals.

8. The clock generation circuit, as recited in claim 5, wherein the first demux circuit is served as a first switch circuit, and the second demux circuit is served as a second switch circuit, wherein the second current source comprises a second power supply terminal and a second ground terminal, wherein one side of the first switch circuit is connected to the second power supply terminal, and the other side of the first switch circuit is connected to one side of the capacitor and a reversed input terminal of the first comparator, one side of the second switch circuit is connected to the second ground terminal, and the other side of the second switch circuit is connected to one side of the capacitor and a non-inverting input terminal of the second comparator.

9. The clock generation circuit, as recited in claim 8, wherein an output terminal of the first comparator is connected to a trigger input terminal of the RS trigger, and an output terminal of the second comparator is connected to a reset input terminal of the RS trigger, wherein an output terminal of the RS trigger outputs clock signals.

10. The clock generation circuit, as recited in claim 2, wherein the first demux circuit is served as a first switch circuit, and the second demux circuit is served as a second switch circuit, wherein the second current source comprises a second power supply terminal and a second ground terminal, wherein one side of the first switch circuit is connected to the second power supply terminal, and the other side of the first switch circuit is connected to one side of the capacitor and a reversed input terminal of the first comparator, one side of the second switch circuit is connected to the second ground terminal, and the other side of the second switch circuit is connected to one side of the capacitor and a non-inverting input terminal of the second comparator.

11. The clock generation circuit, as recited in claim 10, wherein an output terminal of the first comparator is connected to a trigger input terminal of the RS trigger, and an output terminal of the second comparator is connected to a reset input terminal of the RS trigger, wherein an output terminal of the RS trigger outputs clock signals.

12. The clock generation circuit, as recited in claim 11, wherein the first current source comprises a first field effect transistor (FET) MP1, a second FET MP2 connected to the first FET MP1, a ninth FET MN1 connected to the first FET MP1, a tenth FET MN2 connected to the second FET MP2, and a first resistor R1 connected to the tenth FET MN2, wherein the second FET MP2 is connected through a third FET MP3 to the first side of the resistor, the first resistor R1 is connected through an eleventh FET MN3 to the second side of the resistor.

13. The clock generation circuit, as recited in claim 12, wherein the second current source comprises a fourth FET MP4, a fifth FET MP5 connected to the fourth FET MP4, a sixth FET MP6 connected to the fifth FET MP5, a twelfth FET MN4 connected to the fourth FET MP4, a thirteenth FET MN5 connected to the twelfth FET MN4, a fourteenth FET MN6 connected to the sixth FET MP6, and a second resistor connected to the thirteenth FET MN5.

14. The clock generation circuit, as recited in claim 13, wherein the first demux circuit comprises an eighth FET MP8, the second demux circuit comprises a sixteenth FET MN8 connected to the eighth FET MP8.

15. The clock generation circuit, as recited in claim 14, wherein the second current source is connected through a seventh FET MP7 to the eighth FET MP8, and connected through a fifteenth FET MN7 to the sixteenth FET MN8.

16. A clock generation circuit, comprising: a first current source, a resistor connected to the first current source, a second current source, a first demux circuit connected to the second current source, a second demux circuit connected to the second current source, a capacitor connected to the first demux circuit and the second demux circuit, a first comparator connected to the first current source and the capacitor, a second comparator connected to the first current source and the capacitor, and a RS trigger connected both to the first comparator and the second comparator, wherein the RS trigger outputs clock signals to an input control terminal of the first demux circuit and an input control terminal of the second demux circuit, when the first demux circuit is enabled, the capacitor is charged by the second current source, and when the second demux circuit is enabled, the capacitor is discharged by the second current source, wherein the first current source comprises a first field effect transistor (FET) MP1, a second FET MP2 connected to the first FET MP1, a ninth FET MN1 connected to the first FET MP1, a tenth FET MN2 connected to the second FET MP2, and a first resistor R1 connected to the tenth FET MN2, wherein the second FET MP2 is connected through a third FET MP3 to the first side of the resistor, the first resistor R1 is connected through an eleventh FET MN3 to the second side of the resistor.

17. The clock generation circuit, as recited in claim 16, wherein the second current source comprises a fourth FET MP4, a fifth FET MP5 connected to the fourth FET MP4, a sixth FET MP6 connected to the fifth FET MP5, a twelfth FET MN4 connected to the fourth FET MP4, a thirteenth FET MN5 connected to the twelfth FET MN4, a fourteenth FET MN6 connected to the sixth FET MP6, and a second resistor connected to the thirteenth FET MN5.

18. A clock generation circuit, comprising: a first current source, a resistor connected to the first current source, a second current source, a first demux circuit connected to the second current source, a second demux circuit connected to the second current source, a capacitor connected to the first demux circuit and the second demux circuit, a first comparator connected to the first current source and the capacitor, a second comparator connected to the first current source and the capacitor, and a RS trigger connected both to the first comparator and the second comparator, wherein the RS trigger outputs clock signals to an input control terminal of the first demux circuit and an input control terminal of the second demux circuit, when the first demux circuit is enabled, the capacitor is charged by the second current source, and when the second demux circuit is enabled, the capacitor is discharged by the second current source, wherein the first demux circuit comprises an eighth FET MP8, the second demux circuit comprises a sixteenth FET MN8 connected to the eighth FET MP8.

19. The clock generation circuit, as recited in claim 18, wherein the second current source is connected through a seventh FET MP7 to the eighth FET MP8, and connected through a fifteenth FET MN7 to the sixteenth FET MN8.

* * * * *